(12) United States Patent
Brennan et al.

(10) Patent No.: US 6,548,400 B2
(45) Date of Patent: Apr. 15, 2003

(54) METHOD OF FABRICATING INTERLEVEL CONNECTORS USING ONLY ONE PHOTOMASK STEP

(75) Inventors: Kenneth D. Brennan, Austin, TX (US); Qing-Tang Jiang, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/917,364

(22) Filed: Jul. 27, 2001

(65) Prior Publication Data

US 2003/0001272 A1 Jan. 2, 2003

Related U.S. Application Data

(60) Provisional application No. 60/302,054, filed on Jun. 29, 2001.

(51) Int. Cl.[7] .......................................... H01L 21/4763
(52) U.S. Cl. ..................... 438/637; 438/622; 438/623; 438/624; 438/634; 438/638
(58) Field of Search .......................... 438/622, 623, 438/624, 634, 637, 638

*Primary Examiner*—Long Pham
(74) *Attorney, Agent, or Firm*—Frederick J. Telecky, Jr.; W. James Brady, III

(57) ABSTRACT

A method for fabricating circuit interconnects in integrated circuits comprising vertical vias and horizontal trenches between metal lines, wherein only one photomask for creating vias and trenches is needed instead of the conventional two masks. The function of the second mask is replaced by a series of plasma etch steps, which exploit differential etch rates for areas which are open relative to areas which are narrow and constricted.

As a technical advantage of the invention, each interconnection created by the method of the invention is a structure of wider trenches and narrower vias, wherein the diameter of the vias is approximately the same as the narrowest width of the reverse trench pattern, and each via is centered within the trench. The reverse trench pattern surrounding the via is approximately twice the width of the via diameter.

7 Claims, 8 Drawing Sheets

METHOD OF FABRICATING INTERLEVEL CONNECTORS USING ONLY ONE PHOTOMASK STEP

This application claims priority under 35 USC §119 (e) (1) of provisional application No. 60/302,054 filed Jun. 29, 2001.

FIELD OF THE INVENTION

The present invention is related in general to the field of electronic systems and semiconductor devices and more specifically to the structure and etching method of interlevel metal connectors in dual damascene devices using only one photomask step.

DESCRIPTION OF THE RELATED ART

The trend in semiconductor technology to double the functional complexity of its products every 18 months (Moore's "law"), which is still valid today after having dominated the industry for the last three decades, has several implicit consequences. First, the cost per functional unit should drop with each generation of complexity so that the cost of the product with its doubled functionality would increase only slightly. Second, the higher product complexity should largely be achieved by shrinking the feature sizes of the chip components while holding the package dimensions constant; preferably, even the packages should shrink. Third, the increased functional complexity should be paralleled by an equivalent increase in reliability of the product. And fourth, but not least, the best financial profit rewards were held out for the ones who were ahead in the marketplace in reaching the complexity goal together with offering the most flexible products for application.

In order to stay on course with Moore's law, significant technological changes have been introduced in the semiconductor industry in recent years. Newer dielectric materials such as silicon-containing hydrogen silsesquioxane (HSQ) are being preferred due to their lower dielectric constant which helps to reduce the capacitance C in the RC time constant and thus allows higher circuit speed. Since the density and porosity of dielectric films affect the dielectric constant through absorption or desorption of water, films with these characteristics are introduced even when they are mechanically weaker. Films made of aerogels, organic polyimides, and parylenes fall into the same category. These materials are less dense and mechanically weaker than previous standard insulators such as the plasma-enhanced chemical vapor deposited dielectrics. This trend even affects stacks of dielectric layers such as alternating layers of plasma-generated tetraethylorthosilicate (TEOS) oxide and HSQ, or ozone TEOS oxide and HSQ. Since these materials are also used under the bond pad metal, they magnify the risk of device failure by cracking.

Furthermore, copper interconnection has been adapted to silicon integrated circuits due to its low resistance and high electromigration reliability compared to the traditional aluminum interconnection. Single-damascene and dual-damascene methods have been employed for the fabrication of copper interconnection. For multi-level copper interconnects using any of these two methods, improved electromigration reliability, especially improved lifetime of early failures have been reported, for example, in the recent article "A High Reliability Copper Dual-Damascene Interconnection with Direct-Contact Via Structure" (K. Ueno et al, IEEE Internat. Electron Devices Meeting 2000, December 10–13, pp. 265–268).

In spite of progress such as described in that paper, in known technology many problems still remain related to the copper interconnection concept. For example, the copper traces have to be sealed by barrier layers in order to prevent copper migration into the silicon circuitry where copper atoms are known to offer energy levels for electron recombination/generation, acting as electron life-time killers. The same sealing barriers should protect the porous insulating layers of low dielectric constant (so-called low-k materials) against intruding atoms, which may initiate coalescence of micro-voids into larger voids.

In multi-level copper metallization processes, the number of photomask steps required, together with the number of mask alignment steps, increase rapidly. This is especially true for the fabricating interlevel connectors through stacks of low-k insulating layers. The resulting steep cost increase is clearly counterproductive to the goals of Moore's law. Little effort, however, has been dedicated in known technology to reduce the number of photomask steps. An urgent need has, therefore, arisen for a coherent, low-cost method of reducing the number of required photomask steps, especially for fabricating interlevel connectors, and, simultaneously, improve the degree of component reliability. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

SUMMARY OF THE INVENTION

The invention describes a method for fabricating circuit interconnects in integrated circuits comprising vertical vias and horizontal trenches between metal lines, wherein only one photomask for creating vias and trenches is needed instead of the conventional two masks. The function of the second mask is replaced by a series of plasma etch steps, which exploit differential etch rates for areas which are open relative to areas which are narrow and constricted.

In the preferred embodiment of the invention, at least one metal line is overlaid by a stack of insulating layers alternating between etch stop and dielectric layers. The method comprises the steps of depositing a layer of photoresist on the uppermost insulating layer of said stack; patterning said photoresist layer to create a plurality of structures, each structure having outer dimensions defining said trenches, and at least one hole in each trench defining said via; adjacent structures spaced at least by the diameter of said via, and aligned so that the open area between said structures is greater than the area of a single via, thereby providing differential plasma etch rates for said insulating layers, wherein the etch rate is approximately 20% greater outside said structures than inside said hole.

As a technical advantage of the invention, each interconnection created by the method of the invention is a structure of wider trenches and narrower vias, wherein the diameter of the vias is approximately the same as the narrowest width of the reverse trench pattern, and each via is centered within the trench. The reverse trench pattern surrounding the via is approximately twice the width of the via diameter.

As a further technical advantage of the invention, each interconnecting structure is spaced from an adjacent structure by at least the width of the vias. This results in a simple design rule for interconnecting structures.

In the preferred embodiment of the invention, the stack of insulating layers comprises four etch stop layers alternating with three dielectric layers. The stop layers are preferably made of silicon carbide in the thickness range from 30 to 150 nm, and the dielectric layers are preferably porous low-k materials in the thickness range from 200 to 400 nm.

The preferential etch for the stop layers comprises a plasma consisting of C4F8, argon and oxygen, at an etch rate between 100 and 200 nm/min. The preferential etch for the porous dielectric layer comprises a plasma consisting of CH3F, argon and nitrogen, at an etch rate of about 750 nm/min.

It is an aspect of the invention that the method is fully compatible with single damascene and dual damascene process flow and deep sub-micron (0.18 μm and smaller) technologies.

Another aspect of the invention is that it applicable to a wide variety of circuits and process technologies. Examples of semiconductor device families include DRAMs, standard linear and logic products, digital signal processors, microprocessors, digital and analog devices, high frequency and high power devices and both large and small are chip categories.

The preferred metallization is copper; the invention is applicable, however, to a variety of metals. The invention can further be applied to any circuit where metal level-to-level interconnects are presently built with two photomasks and a process reduction to only one mask represents an economical advantage.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

In FIG. 4A, the pits have small diameters, while in FIG. 4B the pit has considerably larger diameter.

DETAILED DESCRIPTION OF THE PREFERRED EMBODIMENTS

The present invention is related to U.S. patent application Ser. No. 09/863,687, filed on May 23, 2001 (Jiang, "Method for Sealing Via Sidewalls in Porous Low-k Dielectric Layers").

Single-damascene and dual-damascene processes have been used to fabricate copper interconnections. This invention applies to dual-damascene technologies. The dual-damascene technology has the advantage of reducing process steps which leads to lower cost. It is, therefore, chosen as the vehicle to describe the present invention.

Figure 1:
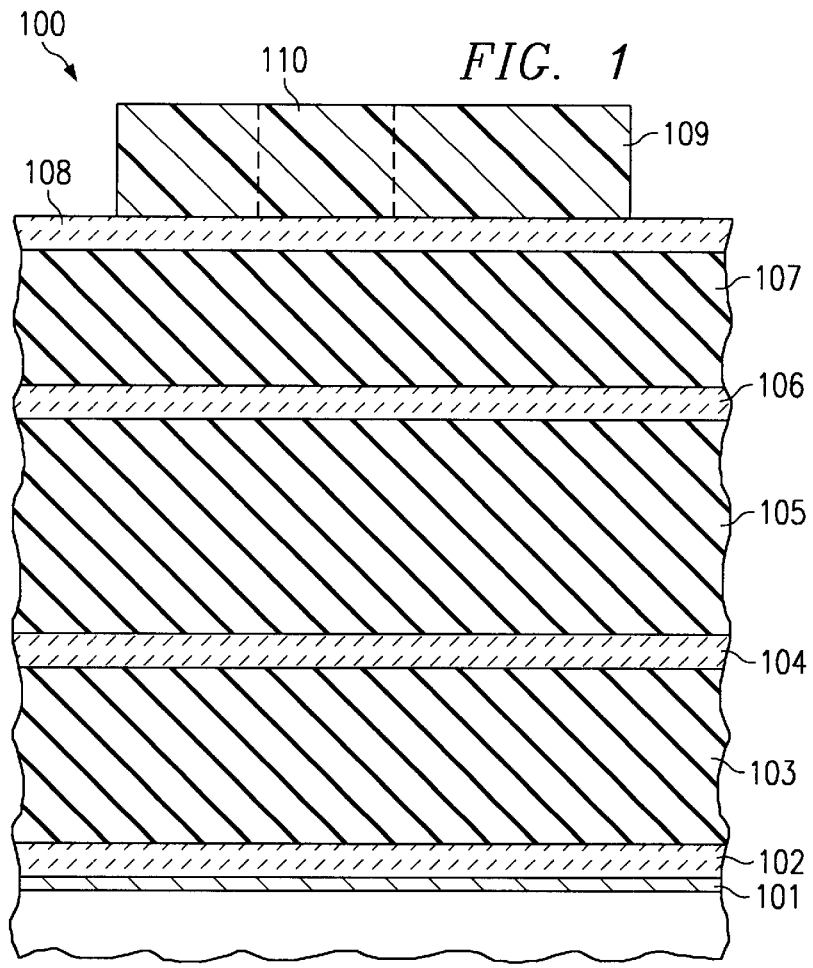
FIG. 1 is a schematic cross section through a stack of insulating layers deposited over the first metal layer of an integrated circuit, with the patterned top photoresist layer described by the present invention.

FIG. 1 is a schematic representation of a dual-damascene interlevel structure, generally designated 100, as preferred for the fabrication of interconnectors and the second metal level. FIG. 1 is generic and not to scale. 101 is the first horizontal metal level, preferably copper. The metal layer is on an insulator on the surface of a semiconductor substrate used for fabricating an integrated circuit. The semiconductor does not necessarily have to be silicon (n-type or p-type), but may be silicon germanium, gallium arsenide or another III-V compound, or another compound material used in semiconductor device manufacturing. The metal level is already patterned into a plurality of individual metal lines, so 101 may be one of those metal lines.

As defined herein, expressions with geometrical connotations like "over", "on top", "overlaid", are relative expressions and refer to the surface of the semiconductor substrate as line (or plane) of origin.

Over the horizontal metal line 101 is a vertical stack of horizontal insulating layers. Directly over metal line 101 is the first etch stop layer 102. It is between 30 and 150 nm thick and selected from a group of materials consisting of silicon carbide, silicon carbon nitride, and silicon nitride. In the embodiment described below, the preferred choice is silicon carbide.

Over stop layer 102 is the first dielectric layer 103. Preferably it is between 200 and 400 nm thick and made of a material having a dielectric constant less than 3.9 ("low-k" dielectric) and contains silicon, oxygen and carbon, and pores with an average diameter of 5 nm, 100% connected. Commercially materials are available under the brand name XLK 2.2 by Dow Corning, USA, or LKD 5109 by JSR, Japan.

First dielectric layer 103 is overlaid by the second etch stop layer 104, preferably made of silicon carbide. For easier control of the etch processes to be described, layer 104 is preferably made slightly thicker than the other stop layers of stack 100.

Over stop layer 104 is the second dielectric layer 105, made of low-k material in the thickness range 200 to 400 nm. Second dielectric layer 105 is overlaid by the third etch stop layer 106, in the 30 to 150 nm thickness range and preferably made of silicon carbide.

Over the third stop layer 106 is the third dielectric layer 107, made of low-k material in the thickness range 200 to 400 nm. Over the third dielectric layer is the fourth etch stop layer 108, preferably made of silicon carbide in the thickness range 30 to 150 nm. Stop layer 108 is the top layer of the insulating stack.

FIG. 1 shows a structure 109, patterned from a photoresist layer deposited on the top stop layer 108. The shape and function of this structure, as it relates to the fabrication of metal interconnects between metal line 101 and the following metal level according to the invention, is described in more detail below. The patterned photoresist structure 109 contains a via 110, outlined by the dashed contours in FIG. 1.

Figure 2:
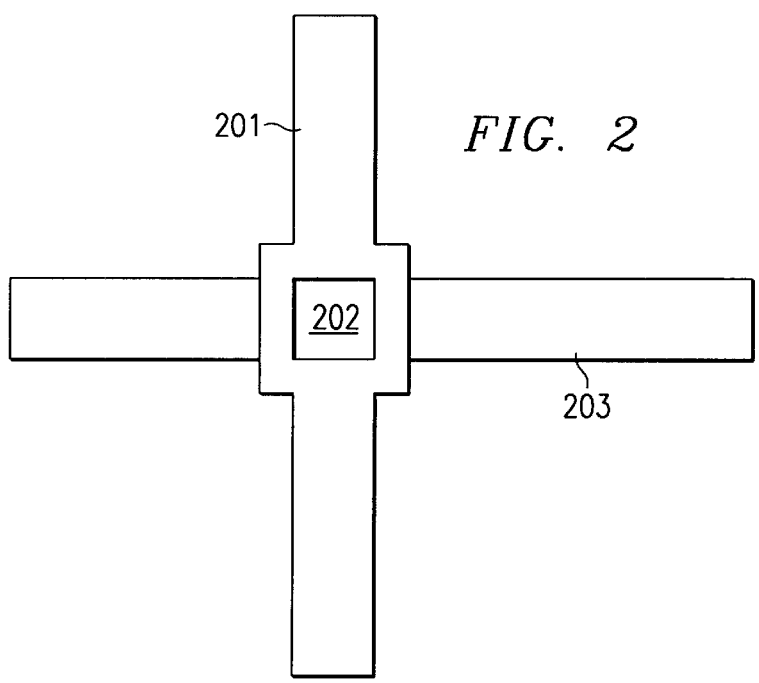
FIG. 2 is a schematic top view of a patterned photoresist structure as an embodiment for creating a metal interconnect to the underlying metal according to the invention.

FIG. 2 is a schematic top view of a simple embodiment of a patterned photoresist structure 201 suitable for creating a trench pattern with a via 202. It should be pointed out that this reverse trench pattern photoresist 201 contains the via 202 in a centered position. After completing the processing, via 202 will be filled with metal and will thus provide electrical connection to the underlying metal line 203.

Figure 3A:
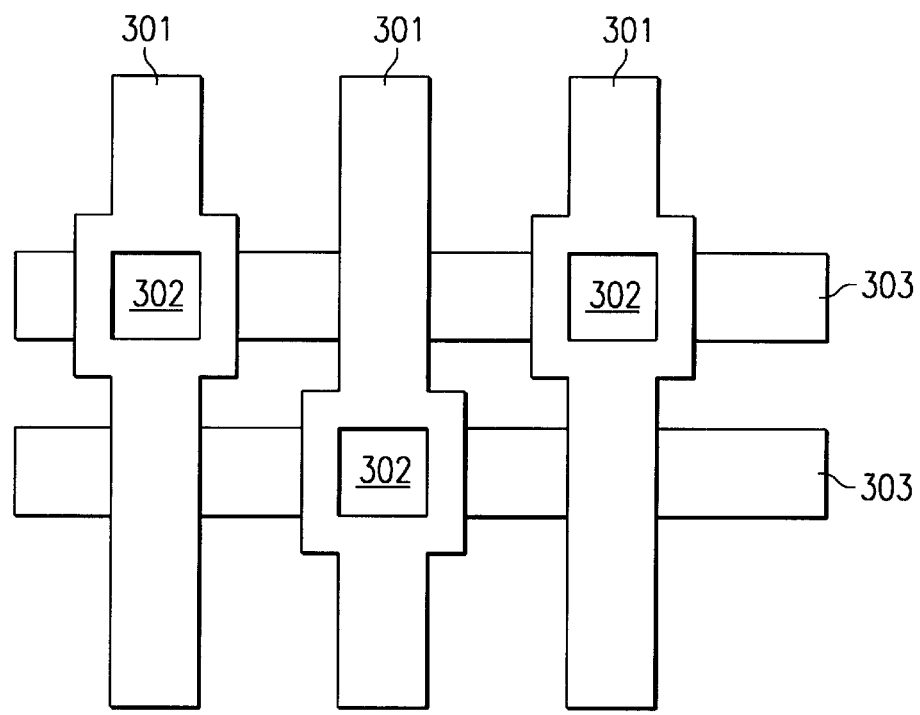
FIGS. 3A and 3B are schematic top views of pluralities of photoresist structures providing various embodiments for creating metal interconnects to underlying metal lines according to the invention.
Figure 3B:
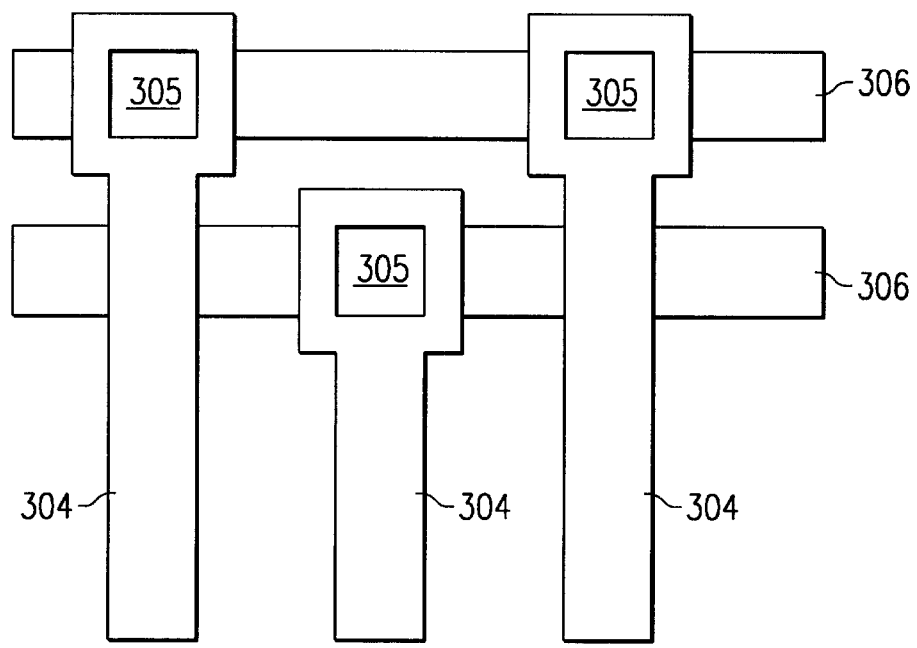

A more elaborate plurality of reverse trench pattern photoresist structures is depicted in the embodiment of FIG. 3A. Each structure consists of a trench pattern 301 with a via 302 centered within the trench. When filled with metal, one or more vias will establish electrical connection to an underlying metal line 303. A variation of this plurality of photoresist structures is depicted in FIG. 3B. Again, the reverse trench pattern photoresist structures determine the extension of the trenches 304 and the position of the centered vias 305 for the connection to the underlying metal lines 306.

Figure 4A:
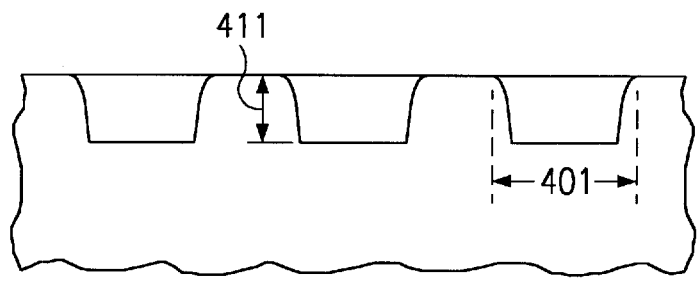
FIGS. 4A and 4B compare microphotographs of cross sections through partially etched vias to illustrate different etch depths.
Figure 4B:
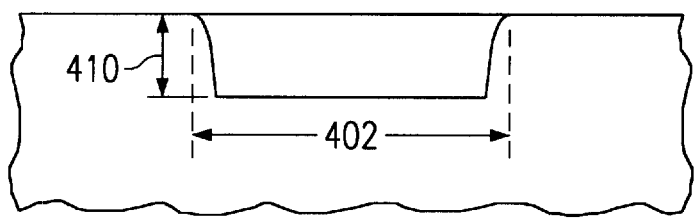

FIGS. 4A and 4B illustrate the experimental observation pivotal for the present invention. Both figures are microphotographs of cross sections through etch pits in SiC layers; the units in both x and y directions are nanometers. The pits have been created by exposing the SiC to a plasma etch in a mixture of C4F8, Ar and O2 (preferred ratios 1:50:8, respectively; ratios are variable; gas flow rates:Ar 600 standard cubic centimeter, O2 100, C4F8 12; when averaged over various pit diameters, the SiC etch rate is about 120 nm/min). The exposure time was equal for the pit arrangements in FIGS. 4A and 4B. The significant difference between the pits in FIGS. 4A and 4B is that the pits in FIG. 4A have a diameter 401 of 250 nm, while the pit in FIG. 4B has a diameter 402 of 600 nm.

In equal time and plasma condition, the etch reaches a depth 410 of 196 nm in the 600 nm wide pit of FIG. 4B, while it reaches only a depth 411 of 158.6 nm in the 250 nm wide pits of FIG. 4A. Consequently, the wider pit etches 24% faster than the narrower pits. Repeated experiments showed an etch variation between 22% and 24%.

Figure 5:
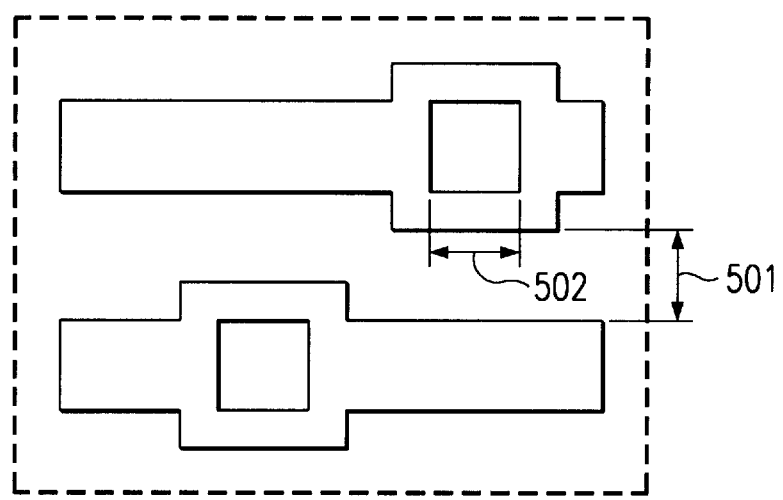
FIG. 5 is the schematic top view of a plurality of photoresist structures illustrating the spatial requirements needed for providing the differential etch conditions of the present invention.

Based on these etch differences, the layout rules for a plurality of reverse trench pattern photoresist structures, each structure having at least one centered via, are as follows (see FIG. 5):

Adjacent trench structures are spaced at least by the diameter of the via, and aligned so that the open (horizontal) area 501 between the adjacent structures is greater than the cross sectional area 502 of a single via;

the width of the resist surrounding the via should be at least R, when the diameter of the via is 2R.

(For example: For 2R=180 nm, R should be at least 90 nm. R may be selected between 50 and 100 nm).

Figure 6:
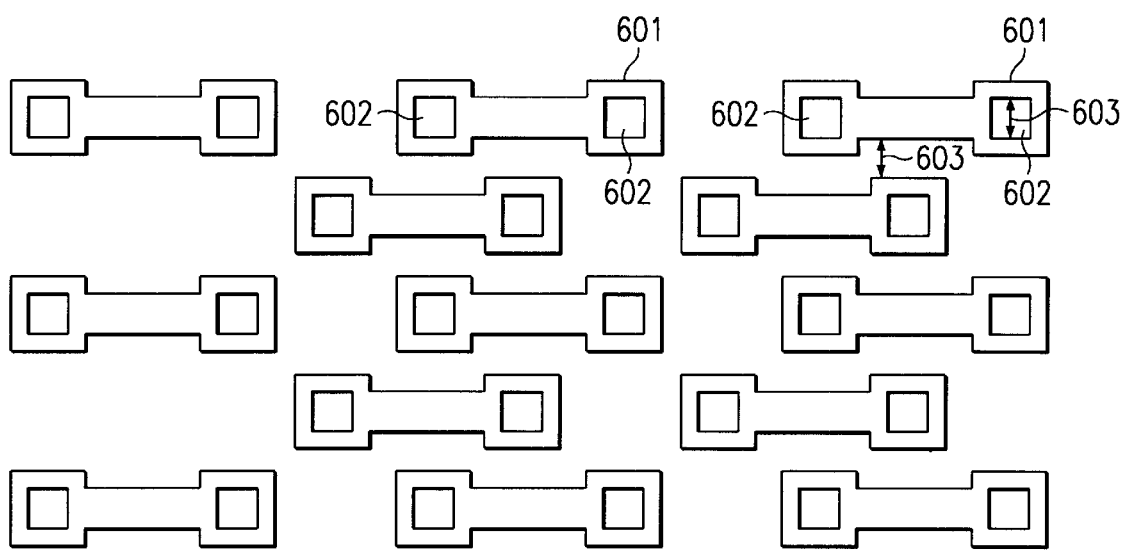
FIG. 6 is the schematic top view of another plurality of other photoresist structures illustrating the spatial requirements needed for providing the differential etch conditions of the present invention.

The layout of the plurality of reverse trench pattern photoresist structures 601 in FIG. 6 is an example illustrating an embodiment of the above rules. In this example, each trench structure 601 has two vias 602 and is spaced from the adjacent trench structure at least by the diameter 603 of the via. Consequently, in an arrangement as shown by the example of FIG. 6, the plasma etch rates for SiC within the vias will be more than 20% smaller than the etch rate between the structures. This etch rate difference is exploited by the process flow of the present invention.

Figure 7A:
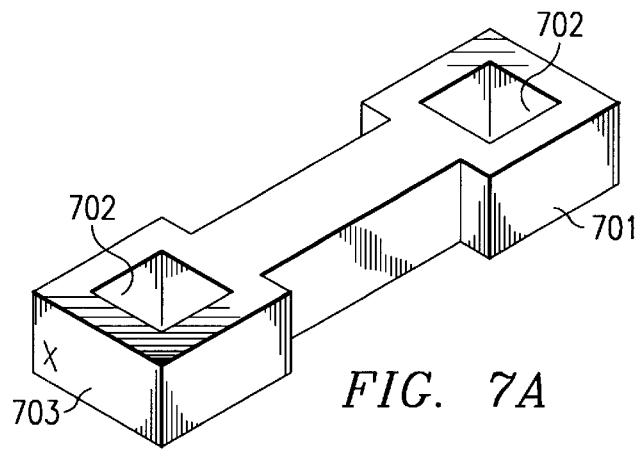
FIG. 7A is an enlarged perspective view of one of the photoresist structures depicted in FIG. 6.
Figure 7B:
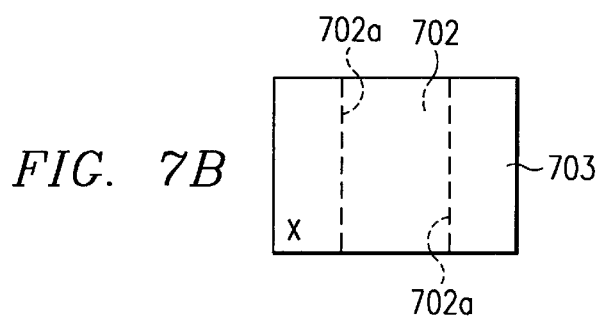
FIG. 7B is a schematic front view of the photoresist structure depicted in FIG. 7A, depicted on a different scale.

One of the photoresist structures in FIG. 6 is shown in FIG. 7A in enlarged perspective view. The reverse trench pattern 701 surrounds two vias 702. The front side 703, marked x, is shown in FIG. 7B (depicted on a different scale) with the via 702 inside; the outlines of the via are indicated by dashed lines 702a. According to the present invention, the reverse trench pattern 701 and the via 702 create the trench and via pattern of the metal interconnection in a dual damascene structure with only one photomark by the following process flow.

FIG. 8:

Forming first horizontal metal interconnector lines 801 (preferably copper) on an insulated semiconductor substrate;

forming a stack of horizontal insulating layers, alternating between first (802), second (804), third (806), and fourth (808) etch stop layers (preferably SiC, alternatively Si3N4) and first (803), second (805) and third (807) dielectric layers (preferably low-k material), the fourth stop layer 808 being the top layer; preferably, the fourth stop layer is between 100 and 150 nm thick (since it serves as a mask layer) and the other stop layers between 30 and 80 nm; the second stop layer is preferably thicker than the first stop layer, since it needs to retain some thickness when the first stop layer is etched through in the final process step.

depositing a first photoresist layer over the fourth stop layer 808;

patterning the photoresist so that at least one resist structure 809 remains, surrounding each desired via location 810, while elsewhere the fourth stop layer 808 is exposed;

the remaining photoresist structure 809 having an outside geometry defining the outline of each of the trenches and further providing a centered vertical hole 810 defining the outline of each of the vias, wherein the area surrounding said photoresist structure 809 is wide open relative to the geometry of the hole 810.

Figure 9:
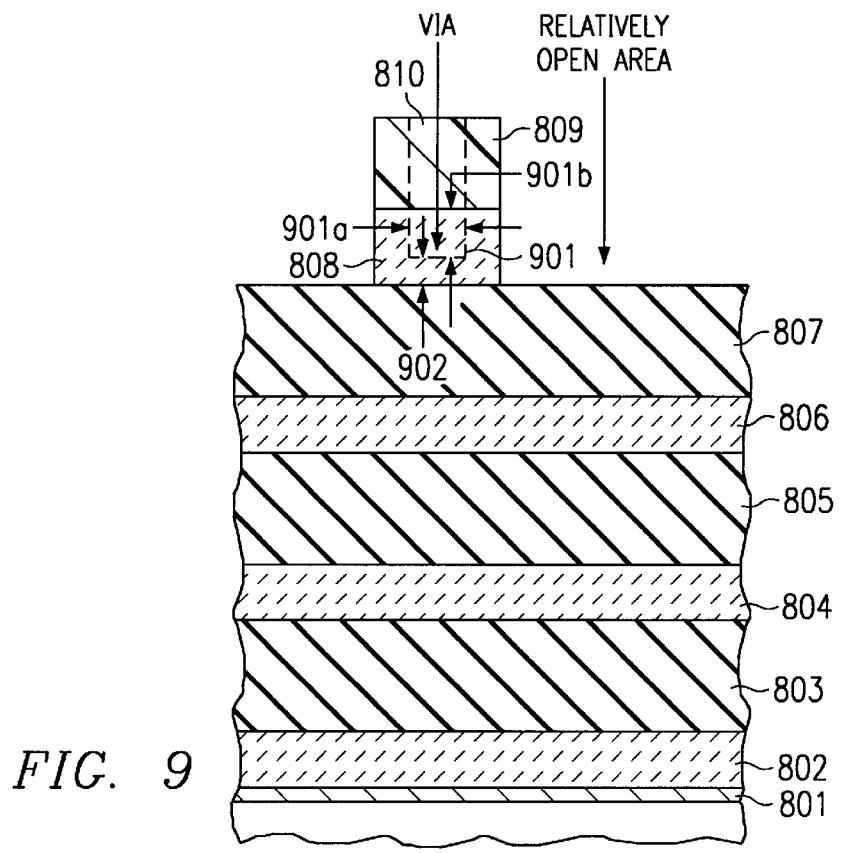
FIG. 9 is the schematic cross section of the stack of insulating layers of FIG. 7 after completing the differential plasma etch step of the fourth (top) stop layer.

FIG. 9: This is the crucial process step of the present invention.

Selectively and differentially etching into the fourth stop layer 808 for a period of time sufficient to remove all of stop layer 808 in the open area outside the photoresist structure 809, thereby exposing the third dielectric layer 807, while only partially removing the stop layer 808, during the same period of time, inside the photoresist structure 809 structure, thereby defining the desired via outline 901 in the fourth stop layer 808.

As stated in conjunction with FIGS. 4A and 4B, the plasma etch process for SiC uses a C4F8/Ar/O2 mixture, providing an etch rate of 100 to 200 nm/min.

At the end of this process step, the via outline 901 in the fourth stop layer 808 includes the desired via diameter 901*a* and via depth 901*b*, but leaves a certain stop layer thickness 902 remaining on the bottom.

Figure 10:
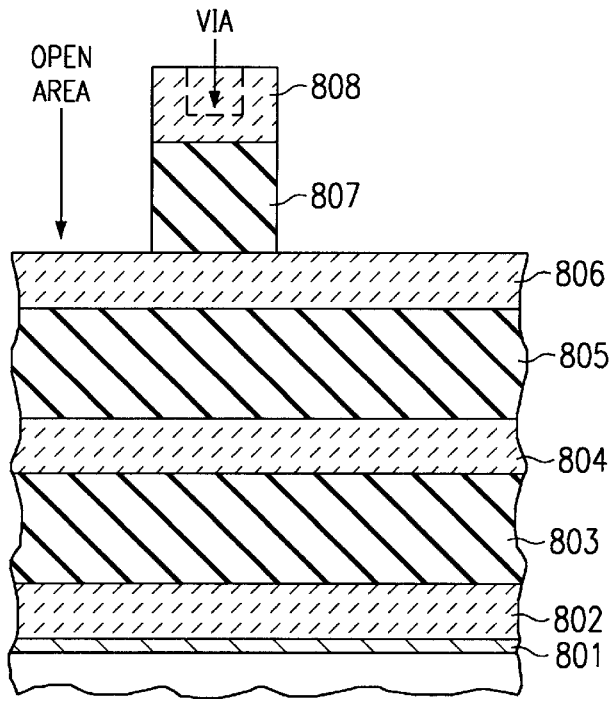
FIG. 10 is the schematic cross section of the stack of insulating layers after completing the etch step of the third dielectric layer removing the residual first photoresist layer.

FIG. 10:
Selectively removing the exposed third dielectric layer 807, thereby exposing the third stop layer 806. The plasma etch process for low-k dielectric material such as JSR uses a CH3F/Ar/N2 mixture, providing an etch rate of 750 nm/min for the dielectric layer and an etch rate of 0 nm/min for the SiC stop layer, or alternatively a C4F8/Ar/N2 mixture, providing an etch rate of 1100 nm/min for the dielectric layer and an etch rate of 120 nm/min for the SiC stop layer.
stripping the photoresist structure (809, see FIG. 9).

Figure 11:
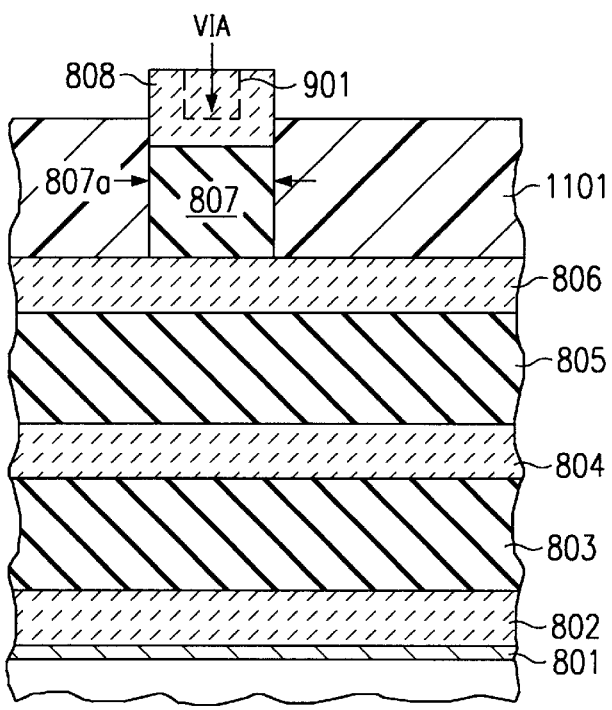
FIG. 11 is the schematic cross section of the stack of insulating layers after spin-on and etch-back of the second photoresist layer.

FIG. 11:
Forming a second photoresist layer 1101 over the exposed third stop layer 806, thereby defining the desired trench outline 807*a* in this second photoresist layer;
selectively etching this photoresist layer to expose the remaining portion of the fourth stop layer 808, with the partially etched via 901 inside.

Figure 12:
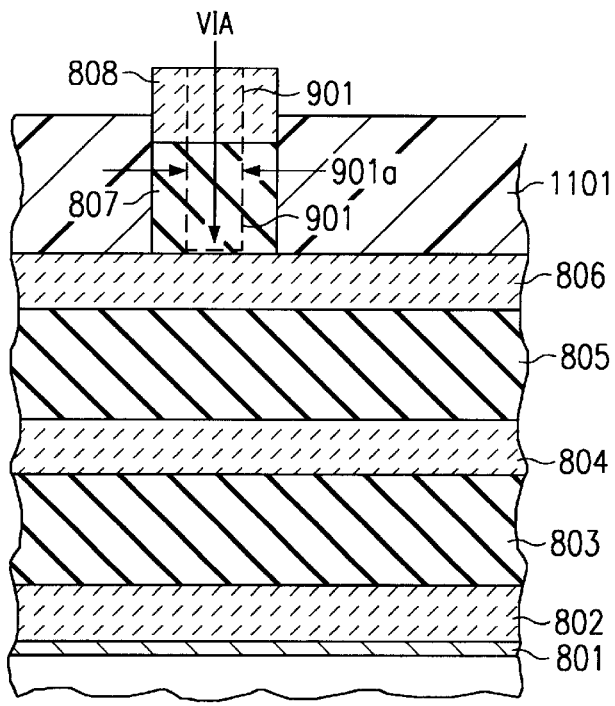
FIG. 12 is the schematic cross section of the stack of insulating layers after completing the via etch through the fourth stop layer and the third dielectric layer.

FIG. 12:
Deepening the via 901 by selectively etching it completely through the fourth stop layer 808 and completely through the third dielectric layer 807 (via diameter 901*a*).

Figure 13:
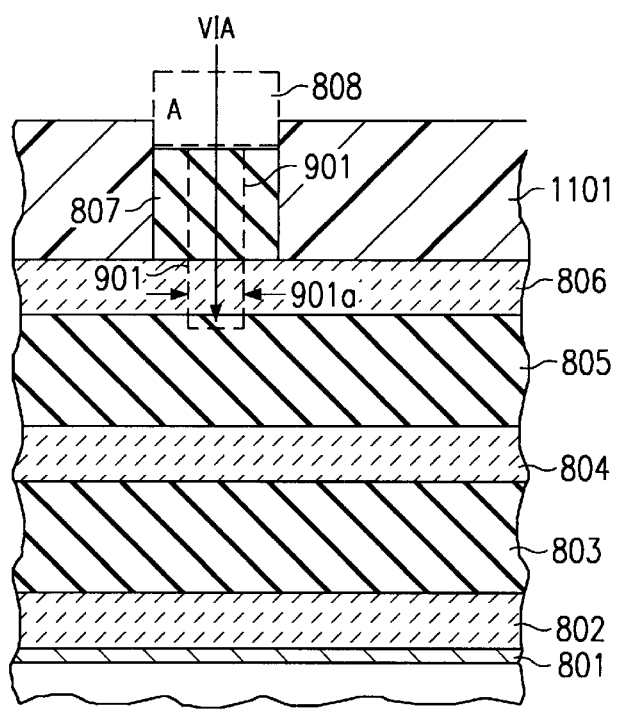
FIG. 13 is the schematic cross section of the stack of insulating layers after etching the via through the third stop layer and removing the remainder of the fourth stop layer.

FIG. 13:
Selectively etching the via 901 through the third stop layer 806, thereby defining the via 901 in the third stop layer 806 (via diameter 901*a*), while concurrently removing the remainder A of the fourth stop layer 808.

Figure 14:
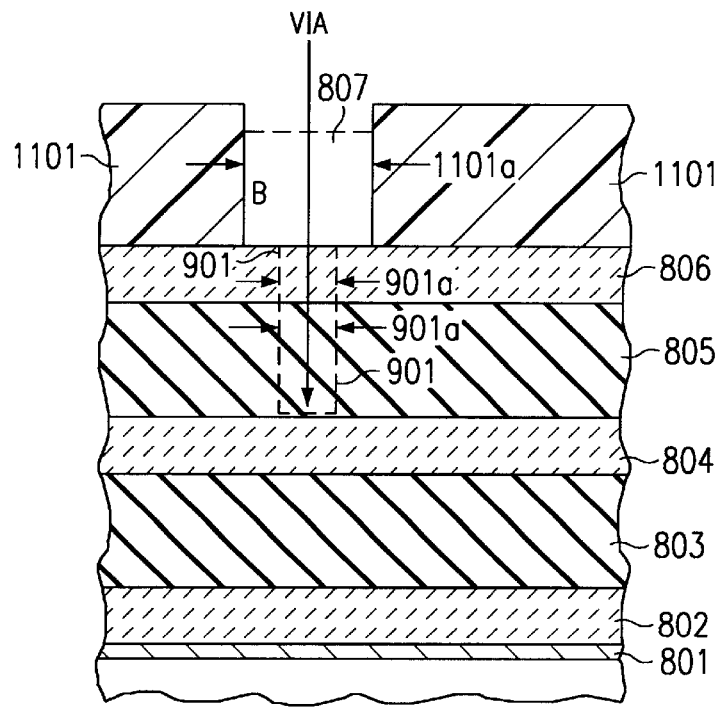
FIG. 14 is the schematic cross section of the stack of insulating layers after etching the via through the second dielectric layer and removing the remainder of the third dielectric layer.

FIG. 14:
Selectively etching the via 901 through the second dielectric layer 805, thereby defining the via 901 in the second dielectric layer 805 (via diameter 901*a*), while concurrently removing the remainder B of the third dielectric layer 807, thereby opening the desired trench outline 1101*a* in the second photoresist layer 1101.

Figure 15:
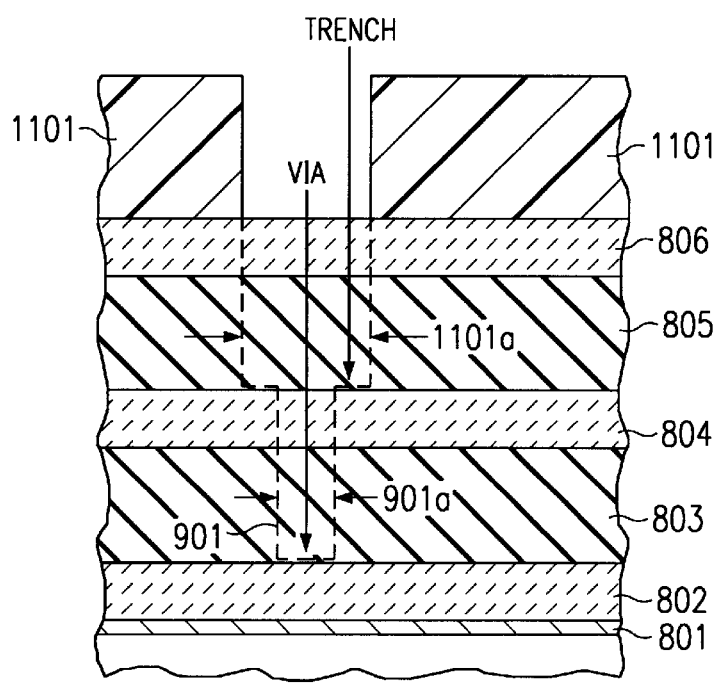
FIG. 15 is the schematic cross section of the stack of insulating layers after etching the via through the second stop layer and the first dielectric layer and, concurrently, the trench through the third stop layer and the second dielectric layer.

FIG. 15:
Selectively continuing to deepen the via 901 through the second stop layer 804 and then the first dielectric layer 803 (via diameter 901*a*), while concurrently etching the trench (outline 1101*a*) through the third stop layer 806 and then the second dielectric layer 805;
selectively etching the via 901 through the first stop layer 802, thereby exposing the first metal interconnector lines 801, while concurrently etching the trench (outline 1101*a*) partially through the second stop layer 804 (not shown in FIG. 15);
removing the second photoresist layer 1101 (not shown in FIG. 15); and depositing a second horizontal metal interconnector layer on the top stop layer 806 while concurrently filling the via 901 and the trench (outline 1101*a*) with metal, thereby creating a vertical interconnect between the second and first horizontal metal layers (not shown in FIG. 15).

Figure 8:
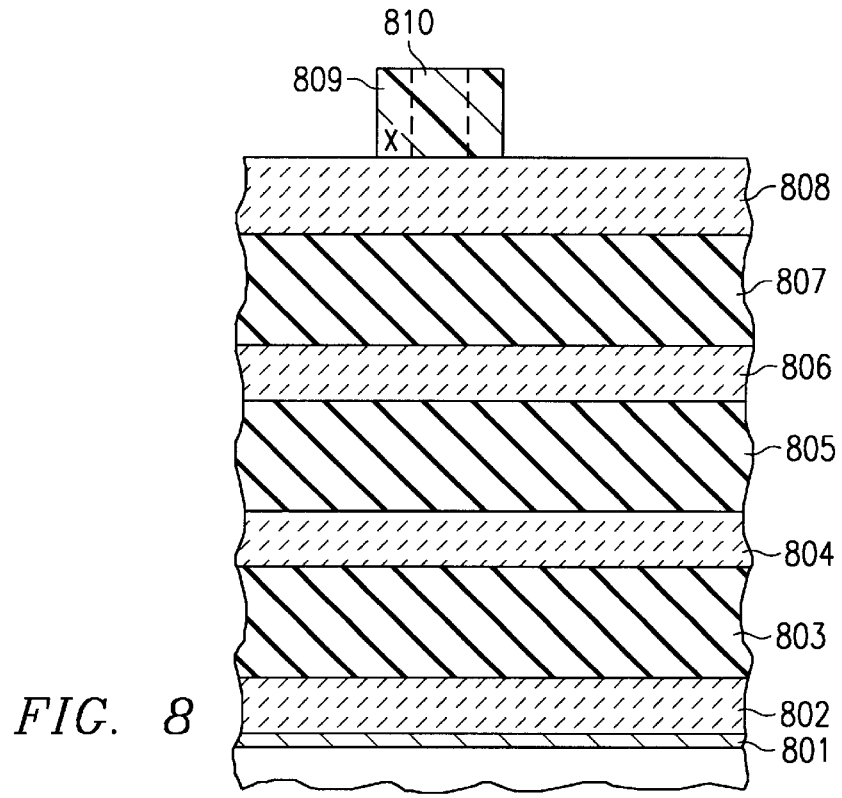
FIG. 8 is a schematic cross section, on a different scale than used in FIG. 1, of the stack of insulating layers deposited over the first metal layer of an integrated circuit. The structure of the first photoresist layer is shown in front view, similar to FIG. 7B.

Consequently, via and trench and thus the interlevel metal connectors have been patterned with only one photomask step (see FIGS. 7A, 7B, and 8).

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. One example is the choice of the etch stop layer material; silicon nitride may be selected instead of silicon carbide. Another example is the choice of the low-k dielectric material. Another example is the fine-tuning of the plasma etch to achieve well defined via and trench wall structures when the via diameter is scaled down with the shrinking feature sizes of the integrated circuit designs. It is therefore intended that the appended claims encompass any such modifications or embodiments.

We claim:

1. A method for fabricating circuit interconnects comprising vias and trenches between metal lines, at least one metal line overlaid by a stack of insulating layers alternating between etch stop and dielectric layers, comprising the steps of:
    depositing a layer of photoresist on the uppermost insulating layer of said stack;
    patterning said photoresist layer to create a plurality of separate masks, each mask having outer dimensions defining said trenches, and at least one hole in each trench defining said via;
    adjacent patterns spaced apart by a distance substantially greater than the diameter of said via, and aligned so that the distance between said masks is substantially greater than the diameter of a single via; and
    exposing the masked surface to a plasma etchant; thereby providing differential plasma etch rates for said insulating layers, whereby the etch rate is approximately 20% greater between said masks than inside said via hole.

2. A method for fabricating integrated circuit interconnects comprising metal-filled vias and trenches, comprising the steps of:
    forming first horizontal metal interconnector lines on an insulated semiconductor substrate;
    forming a stack of horizontal insulating layers, alternating between first, second, third, and fourth etch stop layers and first, second and third dielectric layers, the fourth stop layer being the top layer;
    depositing a first photoresist layer over said fourth stop layer;
    patterning said photoresist so that at least one resist structure remains, surrounding each desired via location, while elsewhere said fourth stop layer is exposed;
    said remaining photoresist structure having an outside geometry defining the desired outline of each of said trenches and further providing a centered vertical hole defining the desired outline of each of said vias, wherein the area surrounding said photoresist structure is wide open relative to the geometry of said hole;

selectively and differentially etching into said fourth stop layer for a period of time sufficient to remove all of the fourth stop layer in said open area outside said photoresist structure, thereby exposing said third dielectric layer, while only partially removing said fourth stop layer, during the same period of time, inside said photoresist structure, thereby defining said desired via outline in said fourth stop layer;

selectively removing said exposed third dielectric layer, thereby exposing said third stop layer;

stripping said photoresist structure;

forming a second photoresist layer over said exposed third stop layer, thereby defining said desired trench outline in said second photoresist layer;

selectively etching said photoresist layer to expose the remaining portion of said fourth stop layer, with partially etched via inside;

deepening said partially etched via by selectively etching it completely through said fourth stop layer and completely through said third dielectric layer;

selectively etching said partially etched via through said third stop layer, thereby defining a via in said third stop layer, while concurrently removing the remainder of said fourth stop layer;

selectively etching said via in said third stop layer through said second dielectric layer, thereby defining a via in said second dielectric layer, while concurrently removing the remainder of said third dielectric layer, thereby opening a desired trench outline in said second photoresist layer;

selectively continuing to deepen said via in said second dielectric layer through said second stop layer and then said first dielectric layer, while concurrently etching said trench through said third stop layer and said second dielectric layer;

selectively etching said via in said first stop layer through said first stop layer, thereby exposing said first metal interconnector lines, while concurrently etching said trench partially through said second stop layer; and depositing a second horizontal metal interconnector layer on the remainder of said second stop layer while concurrently filling said via and trench with metal, thereby creating a vertical interconnect between said second and first horizontal metal layers.

3. The method according to claim 2 wherein said step of forming a stack of horizontal insulating layers comprises the steps of:

depositing the first stop layer at the bottom over said first metal lines;

depositing the first dielectric layer over said bottom first stop layer;

depositing the second stop layer over said first dielectric layer;

depositing the second dielectric layer over said second stop layer;

depositing the third stop layer over said second dielectric layer;

depositing the third dielectric layer over said third stop layer; and depositing the top fourth stop layer over said third dielectric layer.

4. The method according to claim 2 wherein said patterning of said first photoresist layer provides a plurality of masks each having a centered vertical hole, wherein adjacent masks are spaced apart by a distance substantially greater than the diameter of said hole.

5. The method according to claim 2 wherein said steps selectively etching said stop layers comprise an etch technique using a plasma consisting of C4F8/Ar/O2, providing an etch rate of 100 to 200 nm/mm.

6. The method according to claim 2 wherein said steps selectively etching said dielectric layers comprise an etch technique using a plasma consisting of CH3F/Ar/N2, providing an etch rate of 750 nm/mm for said dielectric layer and an etch rate of 0 nm/mm for said stop layer, or consisting of C4F8/Ar/N2, providing an etch rate of 1100 nm/min for said dielectric layer and an etch rate of 120 nm/mm for said stop layer.

7. The method according to claim 2 wherein said steps selectively etching said photoresist layers comprise an etch technique using a plasma consisting of N2/H2, providing an etch rate of 200 nm/mm for said photoresist, while the etch rate for said stop layers and dielectric layers is nil.

* * * * *